US006462626B1

(12) United States Patent
Gharpurey

(10) Patent No.: US 6,462,626 B1
(45) Date of Patent: Oct. 8, 2002

(54) QUADRATURE OUTPUT OSCILLATOR DEVICE

(75) Inventor: Ranjit Gharpurey, Garland, TX (US)

(73) Assignee: Texax Instruments Incorporated, Dallas, TX (US)

( * ) Notice: Subject to any disclaimer, the term of this patent is extended or adjusted under 35 U.S.C. 154(b) by 0 days.

(21) Appl. No.: 09/398,830

(22) Filed: Sep. 17, 1999

Related U.S. Application Data

(60) Provisional application No. 60/101,404, filed on Sep. 22, 1998.

(51) Int. Cl.[7] .......................... H03B 5/20; H03B 27/00; H04B 27/22
(52) U.S. Cl. ...................... 331/108 B; 331/46; 331/59; 331/135; 375/332; 329/304
(58) Field of Search .......................... 331/46, 56, 57, 331/59, 107 R, 108 R, 108 B, 135; 375/329, 332; 329/304

(56) References Cited

U.S. PATENT DOCUMENTS

| | | | | |
|---|---|---|---|---|
| 5,489,878 A | * | 2/1996 | Gilbert | 331/115 |
| 5,561,398 A | | 10/1996 | Rasmussen | 331/36 C |
| 5,917,383 A | * | 6/1999 | Tso et al. | 331/135 |
| 6,025,765 A | * | 2/2000 | Brown | 330/254 |
| 6,313,688 B1 | * | 11/2001 | Lee et al. | 327/113 |
| 6,356,747 B1 | * | 3/2002 | Miquel et al. | 455/304 |
| 6,377,315 B1 | * | 5/2002 | Carr et al. | 348/725 |

FOREIGN PATENT DOCUMENTS

| | | |
|---|---|---|
| EP | 0 523 854 A3 | 1/1993 |

OTHER PUBLICATIONS

"SP24.6: A 900 MHz CMOS LC–Oscillator with Quadrature Outputs", Rofougaran, et al., 1996 IEEE International Solid–State Circuits Conference, Feb. 10, 1996, pp. 392–393.

* cited by examiner

*Primary Examiner*—Young T. Tse
(74) *Attorney, Agent, or Firm*—Ronald O. Neerings; Wade James Brady, III; Frederick J. Telecky, Jr.

(57) ABSTRACT

A quadrature output oscillator device (22) includes a first voltage controlled oscillator (40) and a second voltage controlled oscillator (44). The second voltage controlled oscillator (44) generates a first output (C) and a second output (D) to drive a first amplifier (42). The second output (D) of the second voltage controlled oscillator (44) is a quadrature-phase signal component output (Q) of the quadrature output oscillator device (22). The first voltage controlled oscillator (40) generates a first output (A) and a second output (B) to drive a second amplifier (46). The second output (B) of the first voltage controlled oscillator (40) is an in-phase signal component output (I) of the quadrature output oscillator device (22). The first amplifier (42) generates feedback signals for the first output (A) and the second output (B) of the first voltage controlled oscillator (40). The second amplifier (46) generates feedback signals for the first output (C) and the second output (D) of the second voltage controlled oscillator (44). A gain adjust unit (48) controls the gain for the first amplifier (42) and the second amplifier (46) such that the quadrature output oscillator device (22) produces ideal in-phase (I) and quadrature-phase (Q) signal component outputs.

15 Claims, 2 Drawing Sheets

QUADRATURE OUTPUT OSCILLATOR DEVICE

This application claims priority under 35 USC § 119(e)(1) of provisional application number 60/101,404, filed Sep. 22, 1998.

TECHNICAL FIELD OF THE INVENTION

The present invention relates in general to receiving techniques and more particularly to a quadrature output oscillator device.

BACKGROUND OF THE INVENTION

Typically, quadrature outputs generated from voltage controlled oscillators are not ideal, i.e. the phase difference between the in-phase and quadrature-phase signal components are 90°±some error. The error in this phase difference is mostly due to device mismatch. However, many receiver topologies rely on precise quadrature in order to achieve frequency image rejection in the received signal. The quality of reception is degraded, in the presence of frequency images in the received signal, due to the imprecise quadrature component signal generation in the receiver. Frequency image rejection could be performed by passive filters, but these passive filters result in increased design complexities and higher costs. Therefore, it is desirable to have precise quadrature to achieve the desired receiver circuit performance.

SUMMARY OF THE INVENTION

From the foregoing, it may be appreciated that a need has arisen for a receiver that implements ideal in-phase and quadrature-phase signal components in order to effectively achieve proper frequency image rejection. In accordance with the present invention, a quadrature output oscillator device is provided that substantially eliminates or reduces disadvantages and problems associated with conventional quadrature output voltage controlled oscillator devices.

According to an embodiment of the present invention there is provided a quadrature output oscillator device that includes a first voltage controlled oscillator that generates a first output and a second output, wherein the second output of the first voltage controlled oscillator is an in-phase signal component. A second voltage controlled oscillator also generates a first output and a second output, wherein the second output of the second voltage controlled oscillator is a quadrature-phase signal component. A first amplifier receives the first and second outputs from the second voltage controlled oscillator. The first amplifier generates a first feedback signal coupled to the first output of the first voltage controlled oscillator and a second feedback signal coupled to the second output of the first voltage controlled oscillator. A second amplifier receives the first and second outputs from the first voltage controlled oscillator. The second amplifier generates a first feedback signal coupled to the first output of the second voltage controlled oscillator and a second feedback signal coupled to the second output of the second voltage controlled oscillator. A gain adjustment unit controls a gain of the first amplifier and the second amplifier in order to provide ideal in-phase and quadrature-phase signal components at the second output of the first voltage controlled oscillator and the second output of the second voltage controlled oscillator, respectively.

The present invention provides various technical advantages over conventional quadrature output voltage controlled oscillator devices. For example, one technical advantage is to provide ideal quadrature outputs from voltage controlled oscillators. Another technical advantage is to eliminate the use of passive filters in receiver topologies. Yet another technical advantage is in compensating for device mismatches within voltage controlled oscillators. Other technical advantages may be readily ascertainable by those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
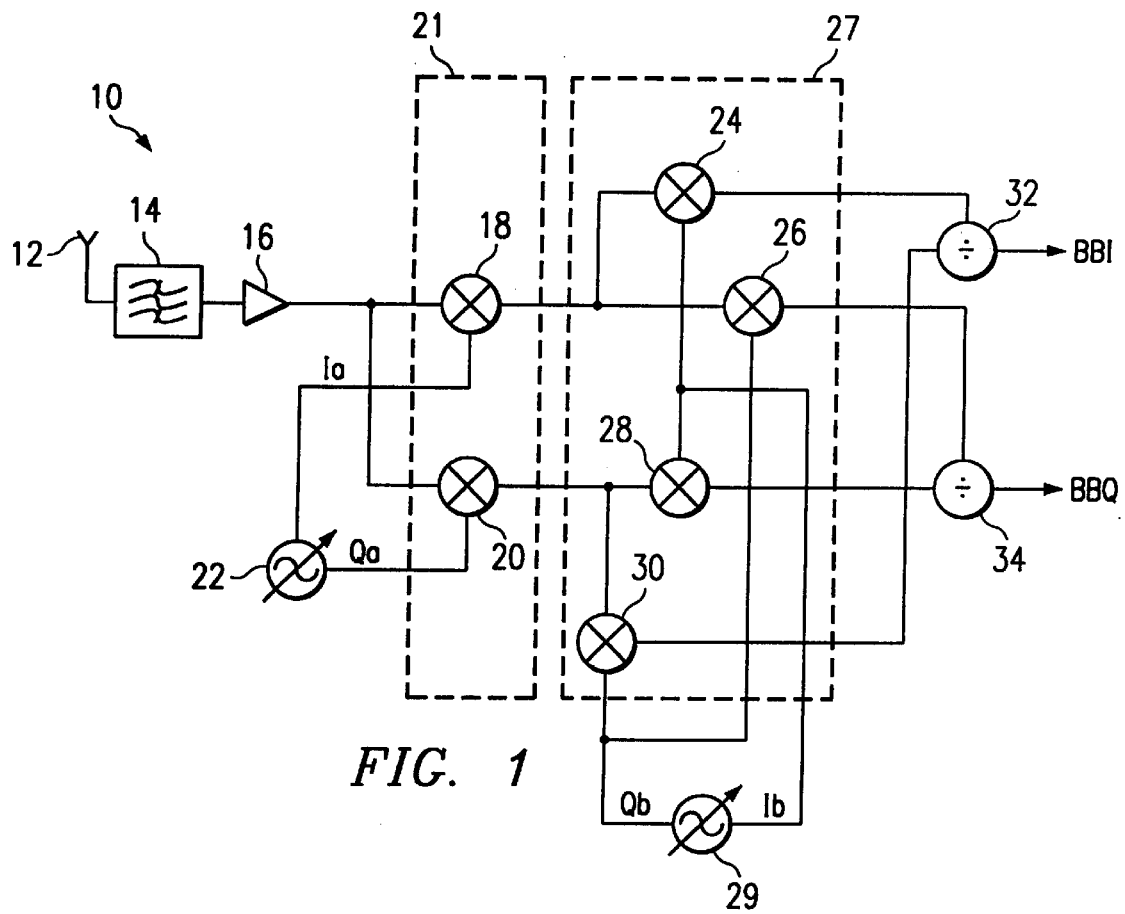
FIG. 1 is a simplified schematic representation of an image reject receiver.

FIG. 1 is a simplified schematic diagram of a radio frequency signal receiver 10. Receiver 10 includes an antenna 12 for receiving a radio frequency signal over a transmission frequency. The radio frequency signal is processed by a filter 14 and enhanced by an amplifier 16. The radio frequency signal, after being filtered and amplified, is applied to a first mixer 18 and a second mixer 20 of a first mixing stage 21. The first mixer 18 is controlled by an in-phase signal component $I_a$ generated by a quadrature output oscillator device 22. The second mixer 20 is controlled by a quadrature-phase signal component $Q_a$ generated by quadrature output oscillator device 22. First mixer 18 generates an output provided to a third mixer 24 and a fourth mixer 26 of a second mixing stage 27. Third mixer 24 is controlled by an in-phase signal component $I_b$ and fourth mixer 26 is controlled by a quadrature-phase signal component $Q_b$ generated by another quadrature output oscillator device 29. Second mixer 20 generates an output provided to a fifth mixer 28 and a sixth mixer 30. Fifth mixer 28 is controlled by in-phase signal component $I_b$ and sixth mixer is controlled by quadrature-phase signal component $Q_b$. Outputs from third mixer 24 and sixth mixer 30 are provided to a selector 32 in order to generate an in-phase representation of the radio frequency signal. Outputs from fourth mixer 26 and fifth mixer 28 are provided to a selector 34 in order to generate a quadrature-phase representation of the radio frequency signal. Depending on the phases of the oscillators applied to the various mixers, the desired down-converted signal can be obtained if selector 32 adds the inputs it receives and selector 34 subtracts the inputs it receives, or vice versa wherein selector 32 acts as a subtractor and selector 34 acts as an adder.

Quadrature output oscillator device 29 is possibly different in implementation from quadrature output oscillator device 22 in that the required oscillator operates at a much lower frequency, and hence does not include inductor devices on-chip. The difference in device type is mainly due to the fact that inductors are difficult to implement on an integrated circuit in order to provide the required lower frequency output. As an example, the frequency of the radio frequency signal received at antenna 12 could be around 1.9

GHz. The frequency generated by quadrature output device 22 is in the range of 1.5–1.7 GHz. Quadrature output device 29 generates the difference between the frequency of the radio frequency signal received at antenna 12 and the frequency generated by quadrature output device 22, that is 200–400 MHz.

The mixers within receiver 10 are used to down-convert the frequency of the radio-frequency signal received at antenna 12 to an intermediate frequency that is the beat frequency of the radio-frequency signal and the local oscillator frequency of the quadrature output oscillator device 22. Any signal located at a frequency lower than the oscillator frequency, at a spacing equal to that between the oscillator frequency and the received radio signal frequency, is defined to be an image signal. The image signal will be down converted to the same intermediate frequency as that produced by the mixing of the oscillator frequency and the received radio signal. The down-converted image signal will interfere with proper reception of the desired down-converted radio signal and degrade receiver performance. Extra image-rejection filters could be used before the mixers to reject this image signal. However these filters are difficult to integrate on to the same circuit as receiver 10. The mixers within receiver 10 are used here to eliminate this down-converted frequency. These mixers rely upon the quadrature property of the quadrature output oscillator device 22. However, the down-converted frequency may not be totally eliminated if there is not a true quadrature relationship between in-phase component and the quadrature phase component Q generated by quadrature output oscillator device 22.

Figure 2:
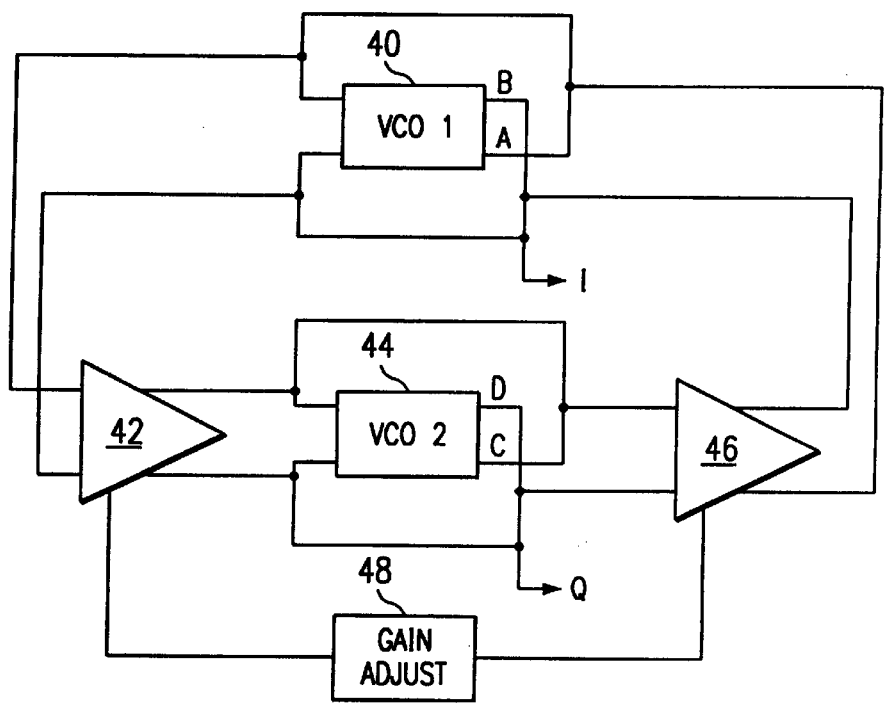
FIG. 2 is a simplified block diagram of a quadrature output oscillator device within the receiver.

FIG. 2 shows a simplified block diagram of quadrature output oscillator device 22 that produces ideal quadrature outputs. Quadrature output oscillator device 22 includes a first voltage controlled oscillator 40 that generates outputs A and B. Outputs A and B are fed back as inputs to first voltage controlled oscillator 40. Quadrature output oscillator device 22 includes a second voltage controlled oscillator 44 that generates outputs C and D. Outputs C and D are fed back as inputs to second voltage controlled oscillator 44. First amplifier 42 generates outputs to drive the feedback A and B signal lines of first voltage controlled oscillator 40 in response to Outputs D and C, respectively, from second voltage controlled oscillator 44. Second amplifier 46 generates outputs to drive the feedback C and D signal lines of second voltage controlled oscillator 44 in response to Outputs A and B, respectively, from first voltage controlled oscillator 40. A gain adjust unit 48 controls a gain for both first amplifier 42 and second amplifier 46 in order to provide ideal quadrature components I and Q from first voltage controlled oscillator 40 and second voltage controlled oscillator 44, respectively.

Figure 3:
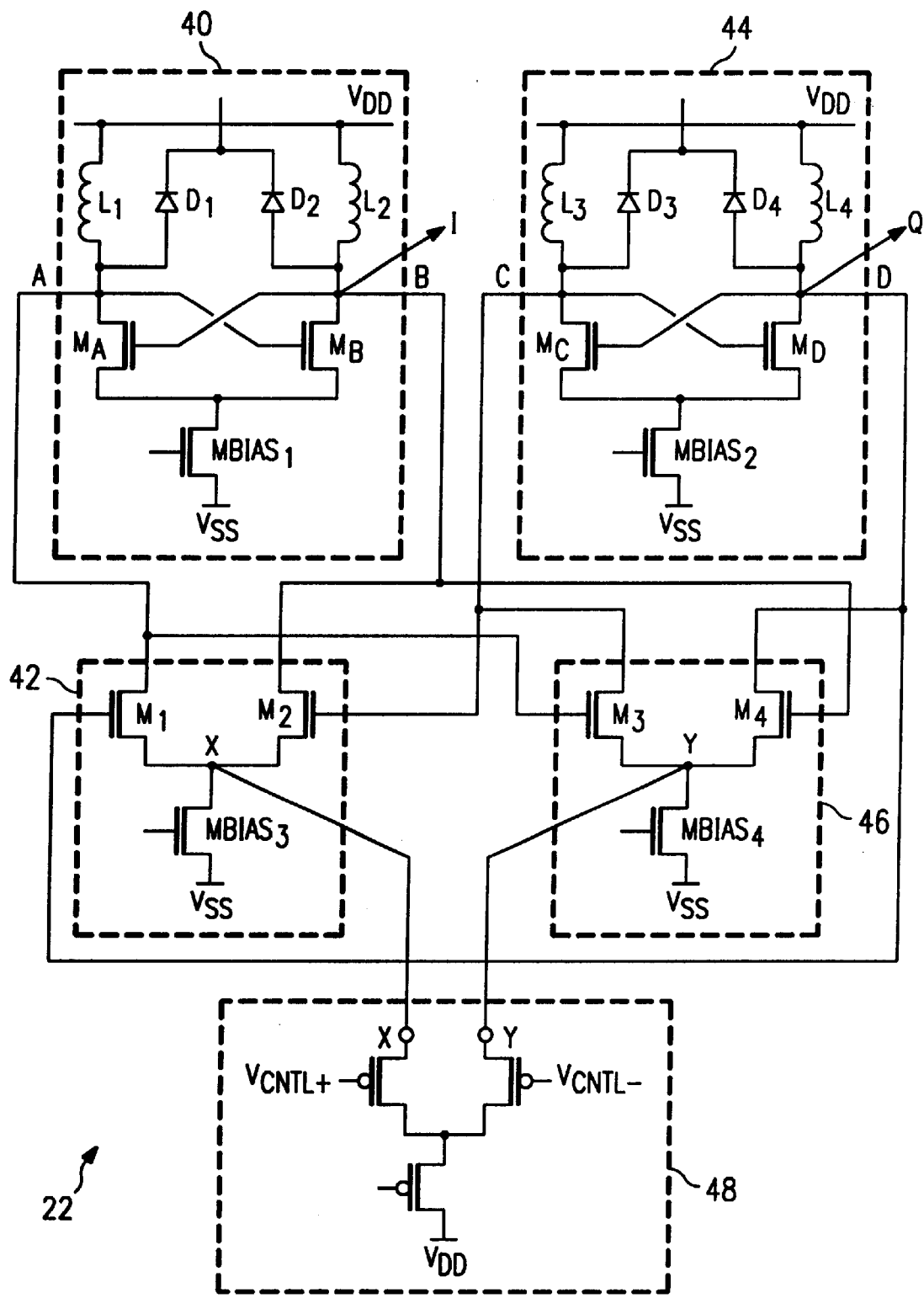
FIG. 3 is a schematic diagram of the quadrature output oscillator device.

FIG. 3 is a schematic diagram of quadrature output oscillator device 22. First voltage controlled oscillator 40 and second voltage controlled oscillator 44 each include a cross-coupled pair of transistors, respectively $M_A$–$M_B$ and $M_C$–$M_D$. Inductor loads are provided by inductors $L_1$, $L_2$, $L_3$, and $L_4$. The center frequency is set and frequency tuning is accomplished by the use of varactor diodes $D_1$, $D_2$, $D_3$, and $D_4$ which are preferably implemented using $p^+$-n junctions in n-wells. The feedback arrangement provided through first amplifier 42 and second amplifier 46 assist in locking first voltage controlled oscillator 40 with second voltage controlled oscillator 44 such that they become stable when they are quadrature locked.

Transistors $M_{BIAS1}$, $M_{BIAS2}$, $M_{BIAS3}$, and $M_{BIAS4}$ provide the current sources for first voltage controlled oscillator 40, second voltage controlled oscillator 44, first amplifier 42, and second amplifier 46, respectively. These current sources are preferably maintained at a fixed level in order to prevent large swings in the circuit due to unbounded growth of oscillations, resulting in large spikes on the VDD supply line that may cause damage to n-well devices tied thereto.

In order to compensate for device mismatches within quadrature output oscillator device 22 that may yield deviations from ideal quadrature outputs, gain adjust unit 48 is provided. For example, a 1% mismatch in device characteristics may cause a 4° to 5° error in quadrature. The bias through $M_1$–$M_2$ transistor pair of first amplifier 42 and $M_3$–$M_4$ transistor pair of second amplifier 46 is varied by changing $V_{CNTL+}$ and $V_{CNTL-}$ inputs into gain adjust unit 48. Controlling the bias through $M_1$–$M_2$ and $M_3$–$M_4$ effectively changes the relative strength of the feedback from $M_A$–$M_B$ to $M_C$–$M_D$ and vice versa. By changing the relative strength of feedback, adjustments to the phase of the I and Q outputs can be accomplished in order to produce ideal quadrature components. Thus, gain adjust unit 48 can be used to electrically trim the phase of the in-phase I and quadrature-phase Q signal components such that they are exactly 90° apart.

Thus, it is apparent that there has been provided, in accordance with the present invention, a quadrature output device that satisfies the advantages set forth above. Although the present invention has been described in detail, it should be understood that various changes, substitutions, and alterations may be readily ascertainable by those skilled in the art and which may be made herein without departing from the spirit and scope of the present invention as defined by the following claims.

What is claimed is:

1. A quadrature output oscillator device, comprising:
   a first voltage controlled oscillator operable to generate a first output and a second output, wherein the second output of the first voltage controlled oscillator is an in-phase signal component;
   a second voltage controlled oscillator operable to generate a first output and a second output, wherein the second output of the second voltage controlled oscillator is a quadrature-phase signal component;
   a first amplifier operable to receive the first and second outputs from the second voltage controlled oscillator, the first amplifier operable to generate a first feedback signal coupled to the first output of the first voltage controlled oscillator and a second feedback signal coupled to the second output of the first voltage controlled oscillator;
   a second amplifier operable to receive the first and second outputs from the first voltage controlled oscillator, the second amplifier operable to generate a first feedback signal coupled to the first output of the second voltage controlled oscillator and a second feedback signal coupled to the second output of the second voltage controlled oscillator; and
   a gain adjust unit operable to control a gain of the first amplifier and the second amplifier in order to provide ideal in-phase and quadrature-phase signal components at the second output of the first voltage controlled oscillator and the second output of the second voltage controlled oscillator, respectively.

2. The quadrature output oscillator device of claim 1, wherein the gain adjust unit receives a control signal used to control the gain of each of the first and second amplifiers.

3. The quadrature output oscillator device of claim 2, wherein the control signal controls a strength of a feedback from the first voltage controlled oscillator to the second voltage controlled oscillator and vice versa.

4. The quadrature output oscillator device of claim 1, wherein the first and second amplifiers lock the first and second voltage controlled oscillators such that they provide stable outputs when they are quadrature locked.

5. The quadrature output oscillator device of claim 1, wherein the first and second voltage controlled oscillators and the first and second amplifiers each include a bias transistor in order to maintain current at a fixed level to prevent voltage spikes from occurring on a supply line of the first and second voltage controlled oscillators.

6. The quadrature output oscillator device of claim 1, wherein the first and second voltage controlled oscillators each include a cross-coupled pair of transistors coupled to inductor loads that resonate with varactor diodes to provide their respective second outputs.

7. The quadrature output oscillator device of claim 1, wherein the first and second voltage controlled oscillators include varactor diodes to set and tune the in-phase signal component and the quadrature-phase signal component generated by the first and second voltage controlled oscillators, respectively.

8. The quadrature output oscillator device of claim 1, wherein the gain adjust unit controls gain of the first and second amplifiers in response to a differential control signal.

9. The quadrature output oscillator device of claim 1, wherein a phase of the in-phase signal component and the quadrature-phase signal component is corrected in response to control of the gain by the gain adjust unit.

10. A method of providing ideal in-phase and quadrature phase signal components, comprising:

generating a first output and a second output from a first oscillator, the second output of the first oscillator being an in-phase signal component;

generating a first output and a second output from a second oscillator, the second output of the second oscillator being a quadrature-phase signal component;

generating a first feedback signal in response to the first and second outputs of the second oscillator, the first feedback signal driving the first output of the first oscillator;

generating a second feedback signal in response to the first and second outputs of the second oscillator, the second feedback signal driving the second output of the first oscillator;

generating a third feedback signal in response to the first and second outputs of the first oscillator, the third feedback signal driving the first output of the second oscillator;

generating a fourth feedback signal in response to the first and second outputs of the first oscillator, the fourth feedback signal driving the second output of the second oscillator; and controlling a strength of the first, second, third, and fourth feedback signals such that the in-phase and quadrature phase signal components are ninety degrees out of phase with respect to each other.

11. The method of claim 10, further comprising:

setting a center frequency for the first and second oscillators.

12. The method of claim 10, further comprising:

tuning a frequency of the first and second oscillators to a desired level.

13. The method of claim 10, further comprising:

receiving one or more control signals to adjust the strength of the first, second, third, and fourth feedback signals.

14. The method of claim 10, further comprising:

controlling a current level in the first and second oscillators to prevent voltage spikes from occurring therein.

15. The method of claim 10, further comprising:

locking the first, second, third, and fourth feedback signals upon reaching an ideal quadrature relationship between the in-phase signal component and the quadrature-phase signal component.

* * * * *